(12) United States Patent
Jiang et al.

(10) Patent No.: US 10,712,395 B2
(45) Date of Patent: Jul. 14, 2020

(54) APPARATUS AND METHOD FOR DETECTING BATTERY STATE OF HEALTH

(71) Applicant: Huawei Technologies Co., Ltd., Shenzhen (CN)

(72) Inventors: Jianping Jiang, Shenzhen (CN); Guanghui Zhang, Shenzhen (CN); Xiaosheng Zeng, Shenzhen (CN); Laisuo Su, Beijing (CN); Jianbo Zhang, Beijing (CN); Zhe Li, Beijing (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 260 days.

(21) Appl. No.: 15/830,782

(22) Filed: Dec. 4, 2017

(65) Prior Publication Data

US 2018/0088181 A1 Mar. 29, 2018

Related U.S. Application Data

(63) Continuation of application No. PCT/CN2016/088147, filed on Jul. 1, 2016.

(30) Foreign Application Priority Data

Jul. 2, 2015 (CN) .......................... 2015 1 0382686

(51) Int. Cl.
  *G01R 31/392* (2019.01)
  *G01R 31/3842* (2019.01)
  (Continued)

(52) U.S. Cl.
  CPC ....... *G01R 31/392* (2019.01); *G01R 31/3648* (2013.01); *H01M 10/486* (2013.01);
  (Continued)

(58) Field of Classification Search
  CPC .............. G01R 31/392; G01R 31/3828; G01R 31/3842; G01R 31/367; G01R 31/3648; H01M 10/486
  See application file for complete search history.

(56) References Cited

U.S. PATENT DOCUMENTS

2007/0001679 A1 1/2007 Cho et al.
2007/0132456 A1 6/2007 Salman et al.
(Continued)

FOREIGN PATENT DOCUMENTS

CN 102077105 A 5/2011
CN 101208847 B 6/2011
(Continued)

OTHER PUBLICATIONS

Haifeng et al., A New SOH Prediction Concept for the Power Lithium-Ion Battery Used on HEVs, 2009 IEEE, pp. 1649-1653 (Year: 2009).*

*Primary Examiner* — Toan M Le
(74) *Attorney, Agent, or Firm* — Leydig, Voit & Mayer, Ltd.

(57) ABSTRACT

A method for detecting a battery state of health includes a current and a voltage are measured twice in a period of time; corresponding model algorithms are selected according to the measured current values; corresponding battery open circuit voltage values and battery state of charge values at a start time and an end time of the period are obtained based on the model algorithms; a battery capacity difference that indicates a present battery retention capacity and a battery capacity difference that indicates a future battery retention capacity are calculated; and a battery state of health value is calculated when impact of a measured battery temperature value is considered.

22 Claims, 4 Drawing Sheets

(51) Int. Cl.
*H01M 10/48* (2006.01)
*G01R 31/36* (2020.01)
*G01R 31/367* (2019.01)
*G01R 31/3828* (2019.01)

(52) U.S. Cl.
CPC ........ *G01R 31/367* (2019.01); *G01R 31/3828* (2019.01); *G01R 31/3842* (2019.01)

(56) References Cited

U.S. PATENT DOCUMENTS

| | | |
|---|---|---|
| 2009/0322283 A1 | 12/2009 | Zhang et al. |
| 2011/0148424 A1 | 6/2011 | Chiang et al. |
| 2012/0105069 A1 | 5/2012 | Wang et al. |
| 2013/0093430 A1 | 4/2013 | Hagimori et al. |
| 2014/0009123 A1 | 1/2014 | Park et al. |
| 2015/0346285 A1 | 12/2015 | Igarashi et al. |
| 2016/0187432 A1 | 6/2016 | Saint-Marcoux et al. |
| 2018/0088181 A1 | 3/2018 | Jiang et al. |

FOREIGN PATENT DOCUMENTS

| | | |
|---|---|---|
| CN | 102866361 A | 1/2013 |
| CN | 103048624 A | 4/2013 |
| CN | 103529398 A | 1/2014 |
| CN | 103558556 A | 2/2014 |
| CN | 103823188 A | 5/2014 |
| CN | 104502858 A | 4/2015 |
| CN | 106324508 A | 1/2017 |
| FR | 3009093 A1 | 1/2015 |
| JP | H06342045 A | 12/1994 |
| JP | 2011215125 A | 10/2011 |
| JP | 2012058028 A | 3/2012 |
| JP | 2014059227 A | 4/2014 |
| WO | 2008026476 A1 | 3/2008 |
| WO | 2008026477 A1 | 3/2008 |
| WO | 2012060597 A2 | 5/2012 |
| WO | 2014132403 A1 | 9/2014 |

* cited by examiner

APPARATUS AND METHOD FOR DETECTING BATTERY STATE OF HEALTH

CROSS-REFERENCE TO RELATED APPLICATIONS

This application is a continuation of International Application No. PCT/CN2016/088147, filed on Jul. 1, 2016, which claims priority to Chinese Patent Application No. 201510382686.X, filed on Jul. 2, 2015. The disclosures of the aforementioned applications are hereby incorporated by reference in their entireties.

TECHNICAL FIELD

The present disclosure mainly relates to technologies for detecting a battery state of health, and in particular, to an apparatus and a method for estimating a battery performance attenuation degree by means of in-service detection.

BACKGROUND

As an apparatus for storing electric energy, a battery can be significantly applied in many fields. In an application field of fixed energy storage, an apparatus such as a data center device, an optical communications device, or a base station has a relatively high requirement on a battery, and a battery state of charge (SOC) needs to be in an almost fully charged state. The battery inevitably ages during long term use. Therefore, a user pays more attention to battery aging. Specifically, battery aging may be monitored by using a battery state of health (SOH), so as to understand current battery performance.

In some existing application fields, a battery internal resistance is correlated to a battery capacity, but an increase in the battery internal resistance does not necessarily cause a loss in the battery capacity. Comparatively, in most application fields, a battery retention capacity is usually used as a parameter index to measure the battery SOH, and can accurately represent battery capacity information.

Currently, a battery retention capacity parameter is obtained mostly in a checking charge/discharge manner. This manner can be used only in an out-of-service state. As a result, the apparatus such as the data center device, the optical communications device, or the base station cannot normally supply power for a load when the battery is discharged or recharged after discharge, and great impact is exerted on a service. Therefore, the battery state of health needs to be detected in an in-service state. However, such a requirement has not been met currently in the prior art.

SUMMARY

The present disclosure provides an apparatus and a method for detecting a battery state of health and a battery management system, so as to detect a battery state of health in an in-service state, and accurately monitor a battery performance attenuation degree.

A first aspect provides an apparatus for detecting a battery state of health, including: a detection unit, configured to determine to measure a current value and a voltage value at a first time and a current value and a voltage value at a second time, and further configured to measure a battery temperature value; a control unit, configured to determine whether the current value at the first time and the current value at the second time are less than a preset threshold, and if a determining result is that the current value at the first time and the current value at the second time are less than the preset threshold, select a second model algorithm to obtain the battery state of health, or if a determining result is that the current value at the first time and the current value at the second time are not less than the preset threshold, select a first model algorithm to obtain the battery state of health; and a data processing unit, configured to: calculate, according to a selection result of the control unit and the current value and the voltage value at the first time, a battery open circuit voltage value and a battery state of charge value that are corresponding to the first time, and calculate, according to the selection result of the control unit and the current value and the voltage value at the second time, a battery open circuit voltage value and a battery state of charge value that are corresponding to the second time; and further configured to: calculate a first battery capacity difference that indicates a present battery retention capacity and a second battery capacity difference that indicates a future battery retention capacity, where the first battery capacity difference and the second battery capacity difference are based on the first time and the second time, and calculate a battery state of health value according to the battery temperature value, the first battery capacity difference, and the second battery capacity difference.

In a first possible implementation manner of the first aspect, the control unit selects the first model algorithm; and the data processing unit is specifically configured to calculate, by using the following formula $OCV=U(t)+R_0 \times I(t) + R_1 \times I(t) + R_2 \times I(t)$, the battery open circuit voltage value corresponding to the first time and the battery open circuit voltage value corresponding to the second time, where OCV represents a battery open circuit voltage, $U(t)$ and $I(t)$ are the voltage value and the current value that are measured by the detection unit, and $R_0$ and $R_1$ are preset model parameters.

In a second possible implementation manner of the first aspect, the control unit selects the second model algorithm; and the data processing unit is specifically configured to calculate, by using the following formula $OCV=U(t)+R_0 \times I(t)+R_1 \times I(t)+R_2 \times I(t)$, the battery open circuit voltage value corresponding to the first time and the battery open circuit voltage value corresponding to the second time, where OCV represents a battery open circuit voltage, $U(t)$ and $I(t)$ are the voltage value and the current value that are measured by the detection unit, and $R_0$, $R_1$ and $R_2$ are preset model parameters.

With reference to the first or the second possible implementation manner of the first aspect, in a third possible implementation manner, the data processing unit is specifically configured to calculate, by using the following formula $OCV=a_1(SOC)^n+a_2(SOC)^{n-1}+ \ldots +a_n(SOC)+b$, the battery state of charge value corresponding to the first time and the battery state of charge value corresponding to the second time, where OCV represents a battery open circuit voltage, SOC represents a battery state of charge, n, $a_1$, $a_2$, $a_n$, and b are preset constant parameters, and n is a positive integer.

With reference to the first or the second possible implementation manner of the first aspect, in a fourth possible implementation manner, the apparatus further includes a memory, configured to store information about a correspondence between a battery open circuit voltage and a battery state of charge; and the data processing unit is specifically configured to obtain a battery state of charge value by reading the information about the correspondence between a battery open circuit voltage and a battery state of charge.

With reference to any one of the first to the fourth possible implementation manners of the first aspect, in a fifth possible implementation manner, after obtaining the battery open circuit voltage value corresponding to the first time and the battery open circuit voltage value corresponding to the second time, the data processing unit is specifically configured to: obtain, according to a correspondence between a battery capacity and a battery open circuit voltage, a battery capacity corresponding to the first time and a battery capacity corresponding to the second time, and calculate the first battery capacity difference according to the following formula: $\Delta Q_1 = |Q_{end} - Q_{start}|$, where $\Delta Q_1$ represents the first battery capacity difference, $Q_{start}$ represents the battery capacity corresponding to the first time, and $Q_{end}$ represents the battery capacity corresponding to the second time.

With reference to the fifth possible implementation manner of the first aspect, in a sixth possible implementation manner, the correspondence between a battery capacity and a battery open circuit voltage is represented by using the following formula: $Q = d_1(OCV)^n + d_2(OCV)^{n-1} + \ldots + d_n(OCV) + g$, where Q represents a battery capacity, OCV represents a battery open circuit voltage, n, $d_1$, $d_2$, $d_n$, and g are preset constant parameters, and n is a positive integer.

With reference to any one of the first to the fourth possible implementation manners of the first aspect, in a seventh possible implementation manner, after obtaining the battery state of charge value corresponding to the first time and the battery state of charge value corresponding to the second time, the data processing unit is specifically configured to: obtain, according to a correspondence between a battery capacity and a battery state of charge value, a battery capacity corresponding to the first time and a battery capacity corresponding to the second time, and calculate the first battery capacity difference according to the following formula: $\Delta Q_1 = |Q_{end} - Q_{start}|$, where $\Delta Q_1$ represents the first battery capacity difference, $Q_{start}$ represents the battery capacity corresponding to the first time, and $Q_{end}$ represents the battery capacity corresponding to the second time.

With reference to the seventh possible implementation manner of the first aspect, in an eighth possible implementation manner, the correspondence between a battery capacity and a battery state of charge is represented by using the following formula: $Q = Q_f \times SOC$, where Q represents a battery capacity, SOC represents a battery state of charge, and $Q_f$ represents a nominal battery capacity at delivery.

With reference to the first, the fifth, or the seventh possible implementation manner of the first aspect, in a ninth possible implementation manner, the data processing unit obtains the second battery capacity difference by performing integral calculation on the current value at the first time and the current value at the second time according to the following formula: $\Delta Q_2 = \eta \int_{t_{start}}^{t_{end}} i(t) dt$, where $\Delta Q_2$ represents the second battery capacity difference, $\eta$ represents battery coulombic efficiency, $t_{start}$ represents the first time, and $t_{end}$ represents the second time.

With reference to the fifth or the seventh possible implementation manner of the first aspect, in a tenth possible implementation manner, the data processing unit is specifically configured to obtain the battery state of health according to the following formula:

$$SOH = k_T \frac{\Delta Q_2}{\Delta Q_1} \times 100\%,$$

where SOH represents the battery state of health, $\Delta Q_2$ represents the first battery capacity difference, $\Delta Q_2$ represents the second battery capacity difference, and $k_T$ represents a temperature modification coefficient.

A second aspect provides a method for detecting a battery state of health, where the method is performed by a detection apparatus. Steps of the method include: determining to measure a current value and a voltage value at a first time; determining whether the current value at the first time is less than a preset threshold, and if a determining result is that the current value at the first time is less than the preset threshold, selecting a second model algorithm to obtain the battery state of health, or if a determining result is that the current value at the first time is not less than the preset threshold, selecting a first model algorithm to obtain the battery state of health; calculating, according to a selection result and the current value and the voltage value at the first time, a battery open circuit voltage value and a battery state of charge value that are corresponding to the first time; determining to measure a current value and a voltage value at a second time; determining whether the current value at the second time is less than the preset threshold, and if a determining result is that the current value at the second time is less than the preset threshold, selecting the second model algorithm to obtain the battery state of health, or if a determining result is that the current value at the second time is not less than the preset threshold, selecting the first model algorithm to obtain the battery state of health; calculating, according to a selection result and the current value and the voltage value at the second time, a battery open circuit voltage value and a battery state of charge value that are corresponding to the second time; calculating a first battery capacity difference that indicates a present battery retention capacity and a second battery capacity difference that indicates a future battery retention capacity, where the first battery capacity difference and the second battery capacity difference are based on the first time and the second time; and measuring a battery temperature value, and calculating a battery state of health value according to the battery temperature value, the first battery capacity difference, and the second battery capacity difference.

In a first possible implementation manner of the second aspect, if the first model algorithm is selected to obtain the battery state of health, the battery open circuit voltage value corresponding to the first time or the battery open circuit voltage value corresponding to the second time is calculated by using the following formula: $OCV = U(t) + R_0 \times I(t) + R_1 \times I(t) + R_2 \times I(t)$, where OCV represents a battery open circuit voltage, U(t) and I(t) are the measured voltage value and the measured current value, and $R_0$ and $R_1$ are preset model parameters.

In a second possible implementation manner of the second aspect, if the second model algorithm is selected to obtain the battery state of health, the battery open circuit voltage value corresponding to the first time and the battery open circuit voltage value corresponding to the second time are calculated by using the following formula: $OCV = U(t) + R_0 \times I(t) + R_1 \times I(t) + R_2 \times I(t)$, where OCV represents a battery open circuit voltage, U(t) and I(t) are the measured voltage value and the measured current value, and $R_0$, $R_1$, and $R_2$ are preset model parameters.

With reference to the first or the second possible implementation manner of the second aspect, in a third possible implementation manner, the battery state of charge value corresponding to the first time and the battery state of charge value corresponding to the second time are calculated by using the following formula: $OCV = a_1(SOC)^n + a_2(SOC)^{n-1} + \ldots + a_n(SOC) + b$, where OCV represents a battery open circuit voltage, SOC represents a battery state of charge, n, $a_1 a_2 a_n$ and b are preset constant parameters, and n is a positive integer.

With reference to the first or the second possible implementation manner of the second aspect, in a fourth possible implementation manner, a battery state of charge value is obtained by reading pre-stored information about a correspondence between a battery open circuit voltage and a battery state of charge.

With reference to the first or the fourth possible implementation manner of the second aspect, in a fifth possible implementation manner, after the battery open circuit voltage value corresponding to the first time and the battery open circuit voltage value corresponding to the second time are obtained, a battery capacity corresponding to the first time and a battery capacity corresponding to the second time are obtained according to a correspondence between a battery capacity and a battery open circuit voltage, and the first battery capacity difference is calculated according to the following formula: $\Delta Q_1 = |Q_{end} - Q_{start}|$, where $\Delta Q_1$ represents the first battery capacity difference, $Q_{start}$ represents the battery capacity corresponding to the first time, and $Q_{end}$ represents the battery capacity corresponding to the second time.

With reference to the fifth possible implementation manner of the second aspect, in a sixth possible implementation manner, the correspondence between a battery capacity and a battery open circuit voltage is represented by using the following formula: $Q = d_1(OCV)^n + d_2(OCV)^{n-1} + \ldots + d_n(OCV) + g$, where Q represents a battery capacity, OCV represents a battery open circuit voltage, n, $d_1$, $d_2$, $d_n$, and g are preset constant parameters, and n is a positive integer.

With reference to any one of the first to the fourth possible implementation manners of the second aspect, in a seventh possible implementation manner, after the battery state of charge value corresponding to the first time and the battery state of charge value corresponding to the second time are obtained, a battery capacity corresponding to the first time and a battery capacity corresponding to the second time are obtained according to a correspondence between a battery capacity and a battery state of charge value, and the first battery capacity difference is calculated according to the following formula: $\Delta Q_1 = |Q_{end} - Q_{start}|$, where $\Delta Q_1$ represents the first battery capacity difference, $Q_{start}$ represents the battery capacity corresponding to the first time, and $Q_{end}$ represents the battery capacity corresponding to the second time.

With reference to the seventh possible implementation manner of the second aspect, in an eighth possible implementation manner, the correspondence between a battery capacity and a battery state of charge is represented by using the following formula: $Q = Q_f \times SOC$, where Q represents a battery capacity, SOC represents a battery state of charge, and $Q_f$ represents a nominal battery capacity at delivery.

With reference to the first, the fifth, or the seventh possible implementation manner of the second aspect, in a ninth possible implementation manner, the second battery capacity difference is obtained by performing integral calculation on the current value at the first time and the current value at the second time according to the following formula: $\Delta Q_2 = \eta \int_{t_{start}}^{t_{end}} i(t)dt$, where $\Delta Q_2$ represents the second battery capacity difference, $\eta$ represents battery coulombic efficiency, $t_{start}$ represents the first time, and $t_{end}$ represents the second time.

With reference to the fifth or the seventh possible implementation manner of the second aspect, in a tenth possible implementation manner, the battery state of health value is calculated according to the following formula:

$$SOH = k_T \frac{\Delta Q_2}{\Delta Q_1} \times 100\%,$$

where SOH represents the battery state of health, $\Delta Q_2$ represents the first battery capacity difference, $\Delta Q_2$ represents the second battery capacity difference, and $k_T$ is a temperature modification coefficient.

A third aspect provides a battery management system, including a battery, a load, and an apparatus for detecting a battery state of health. The apparatus for detecting a battery state of health is connected between the battery and the load. The apparatus for detecting a battery state of health is configured to determine to measure a current value and a voltage value at a first time and a current value and a voltage value at a second time, and measure a battery temperature value; configured to determine whether the current value at the first time and the current value at the second time are less than a preset threshold, and if a determining result is that the current value at the first time and the current value at the second time are less than the preset threshold, select a second model algorithm to obtain the battery state of health, or if a determining result is that the current value at the first time and the current value at the second time are not less than the preset threshold, select a first model algorithm to obtain the battery state of health; configured to: calculate, according to a selection result and the current value and the voltage value at the first time, a battery open circuit voltage value and a battery state of charge value that are corresponding to the first time, and calculate, according to the selection result and the current value and the voltage value at the second time, a battery open circuit voltage value and a battery state of charge value that are corresponding to the second time; and further configured to: calculate a first battery capacity difference that indicates a present battery retention capacity and a second battery capacity difference that indicates a future battery retention capacity, where the first battery capacity difference and the second battery capacity difference are based on the first time and the second time, and calculate a battery state of health value according to the battery temperature value, the first battery capacity difference, and the second battery capacity difference.

In a first implementation manner of the third aspect, if the system is located in a data center device, the load is a processor of the data center device; or if the system is located in a base station device, the load is a baseband radio frequency processing unit of the base station; or if the system is located in an optical communications device, the load is a main control board of the optical communications device.

With reference to the first implementation manner of the third aspect, in a second implementation manner, the system further includes a charge and discharge apparatus connected to the apparatus for detecting a battery state of health, the battery, and the load, where the charging/discharging apparatus is configured to charge and discharge the battery.

With reference to the first or the second implementation manner of the third aspect, in a third implementation manner, the system further includes a display apparatus, where the display apparatus is separately connected to the battery and the apparatus for detecting a battery state of health, and the display apparatus is configured to display the battery state of health value that is output by the apparatus for detecting a battery state of health.

Multiple specific implementation manners of the apparatus for detecting a battery state of health have been described in the first aspect.

A fourth aspect provides a computer-readable storage medium, including a program instruction, where the program instruction makes an apparatus for detecting a battery state of health perform the following steps: determining to measure a current value and a voltage value at a first time; determining whether the current value at the first time is less than a preset threshold, and if a determining result is that the current value at the first time is less than the preset threshold, selecting a second model algorithm to obtain the battery state of health, or if a determining result is that the current value at the first time is not less than the preset threshold, selecting a first model algorithm to obtain the battery state of health; calculating, according to a selection result and the current value and the voltage value at the first time, a battery open circuit voltage value and a battery state of charge value that are corresponding to the first time; determining to measure a current value and a voltage value at a second time; determining whether the current value at the second time is less than the preset threshold, and if a determining result is that the current value at the second time is less than the preset threshold, selecting the second model algorithm to obtain the battery state of health, or if a determining result is that the current value at the second time is not less than the preset threshold, selecting the first model algorithm to obtain the battery state of health; calculating, according to a selection result and the current value and the voltage value at the second time, a battery open circuit voltage value and a battery state of charge value that are corresponding to the second time; calculating a first battery capacity difference that indicates a present battery retention capacity and a second battery capacity difference that indicates a future battery retention capacity, where the first battery capacity difference and the second battery capacity difference are based on the first time and the second time; and measuring a battery temperature value, and calculating a battery state of health value according to the battery temperature value, the first battery capacity difference, and the second battery capacity difference.

According to the detection apparatus, the detection method, and the battery management system that are provided in the embodiments of the present disclosure, a battery SOH can be detected in an in-service state, and battery aging can be monitored accurately and in a timely manner, so as to ensure that an apparatus such as a data center device, an optical communications device, or a base station normally supplies power for a load, and avoid affecting a service. In addition, because detection is performed based on the in-service state in the embodiments of the present disclosure, in comparison with a detection method in an out-of-service state in the prior art, a battery SOH value is relatively accurate, and the battery SOH value is relatively reliable in application.

After the drawings and detailed descriptions in the following are researched, another system, method, feature, and advantage become obvious for persons of ordinary skill in the art. It is required that the another system, method, feature, and advantage are all included in the descriptions, are within the scope of the present disclosure, and are protected by the appended claims.

Figure 1:
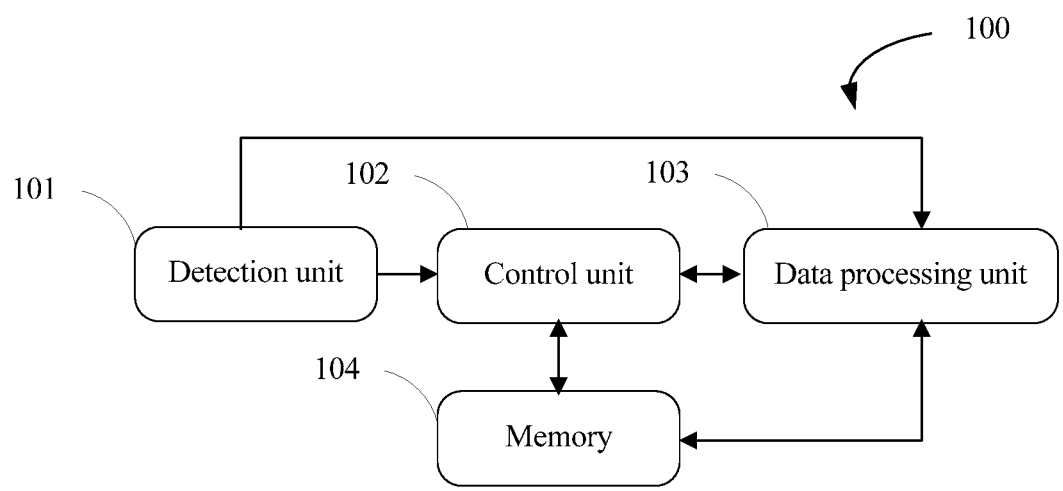
FIG. 1 is a schematic structural diagram of an apparatus for detecting a battery state of health according to an embodiment of the present disclosure.

In the whole drawings, a same reference symbol or description represents similar but not necessarily completely same components. Examples of embodiments described in this specification are easily modified or replaced into another form. Therefore, specific embodiment is illustrated by using examples in the drawings and is described in detail in this specification. However, the examples of embodiments described in this specification are not intended to limit the disclosed specific form. Instead, the present disclosure covers all modifications, equivalence, and replacements that fall within the scope of the appended claims.

DESCRIPTION OF EMBODIMENTS

The following explains and describes some professional nouns appeared above and professional nouns appeared subsequently, so as to help understand this application.

A battery SOC refers to a ratio of a remaining battery capacity to a battery capacity in a fully charged state.

A battery SOH refers to a ratio of a full-charge capacity after a battery ages to an initial battery capacity at delivery.

A battery retention capacity refers to a remaining battery full-charge capacity when a battery is used for a period of time or is not used for a long term.

Battery aging refers to battery performance attenuation when a battery is used for a period of time or is not used for a long term.

An open circuit voltage (OCV) refers to end voltage of a battery in an open circuit state.

This specification provides various technical solutions by using various embodiments, so as to measure a battery state of health in an in-service state.

To make the objectives, technical solutions, and advantages of the this application more understandable, the following provides detailed descriptions. The detailed descriptions provide various embodiments of a device and/or a process by using block diagrams, flowcharts, and/or examples. These block diagrams, flowcharts, and/or examples include one or more functions and/or operations. Therefore, persons in the art may understand that each function and/or operation in the block diagrams, the flowcharts, and/or the examples may be performed independently and/or jointly by using much hardware, software, and firmware, and/or any combination thereof.

FIG. 1 is a schematic structural diagram of an apparatus for detecting a battery state of health according to an embodiment of the present disclosure. Referring to FIG. 1, an apparatus 100 for detecting a battery state of health includes a detection unit 101, a control unit 102, a data processing unit 103, and a memory 104.

The detection unit 101 may be configured to: measure a battery voltage, and output the measured voltage value to the control unit 102. Then the control unit 102 stores the voltage value in the memory 104. The battery voltage is a battery output voltage and is measured when the battery is being charged or discharged. The battery voltage value falls between a final discharging voltage value and a maximum charging voltage value.

Further, the detection unit 101 may be further configured to measure a current that passes through a resistor (not shown in the figure), and then the control unit 102 stores the current value in the memory 104.

Further, the detection unit 101 may be further configured to: measure a time required for a battery to be fully charged and discharged, and output measured time information to the control unit 102. Then the control unit 102 stores the time information in the memory 104.

Further, the detection unit 101 may be further configured to: measure a battery temperature, and output the measured battery temperature value to the control unit 102. Then the control unit 102 stores the battery temperature value in the memory 104.

The control unit 102 may be configured to receive measured information that is output by the detection unit 101, such as the battery voltage value, the battery current value, the time required for the battery to be charged/discharged, or the battery temperature value. Then the control unit 102 stores the measured information in the memory 104. The control unit 102 may be further configured to read the information stored in the memory 104. Moreover, the control unit 102 may select a battery model algorithm according to preset configuration, perform convergence determining on OCV and SOC that are obtained by the data processing unit 103, and determine whether an OCV value and an SOC value meet an accuracy requirement.

The data processing unit 103 may be configured to receive the measured information that is output by the detection unit 101, or may be configured to read the information stored in the memory 104, or may perform corresponding operation processing based on instruction information that is output by the control unit 102.

The memory 104 may be a well-known semiconductor component capable of recording and deleting data, and the semiconductor component is, for example, an RAM, an ROM, or an EEPROM, or a mass storage medium like a hard disk.

Figure 2:
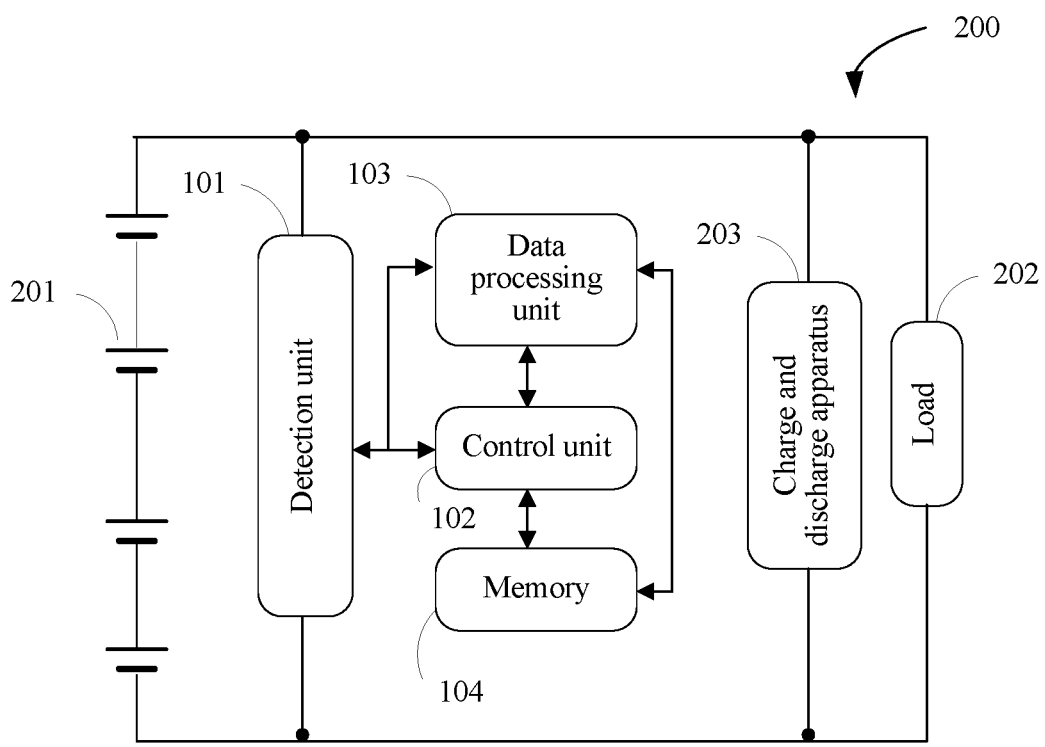
FIG. 2 is a schematic structural diagram of a battery management system according to an embodiment of the present disclosure.

FIG. 2 is a schematic structural diagram of a battery management system according to an embodiment of the present disclosure. Referring to FIG. 2, in a battery management system 200, an apparatus 100 for detecting a battery state of health is connected between a battery 201 and a load 202. The system 200 may further include a charge and discharge apparatus 203 connected to the apparatus 100 for detecting a battery state of health, the battery 201, and the load 202. The system may be located in an apparatus such as a data center device, an optical communications device, or a base station.

The battery 201 includes at least one battery cell, and may use a recyclable and rechargeable manner. A type of the battery 201 is not specifically limited, and may include a lithium-ion battery, a lithium-polymer battery, a nickel-cadmium battery, a nickel-hydrogen battery, a nickel-zinc battery, or the like.

A type of the load 202 is not specifically limited, and may be a processor of the data center device, a baseband radio frequency processing unit of the base station, a main control board of the optical communications device, or a portable electronic apparatus such as a mobile phone, a tablet computer, a camera, or the like.

The charge and discharge apparatus 203 is configured to perform charging/discharging processing on the battery 201.

The apparatus 100 for detecting a battery state of health may output a battery SOH value obtained by means of in-service detection to a display apparatus (not shown in the figure). The display apparatus uses any apparatus capable of visually displaying the battery SOH value. For example, the display apparatus may be an LCD display, or an LED display.

Figure 3A:
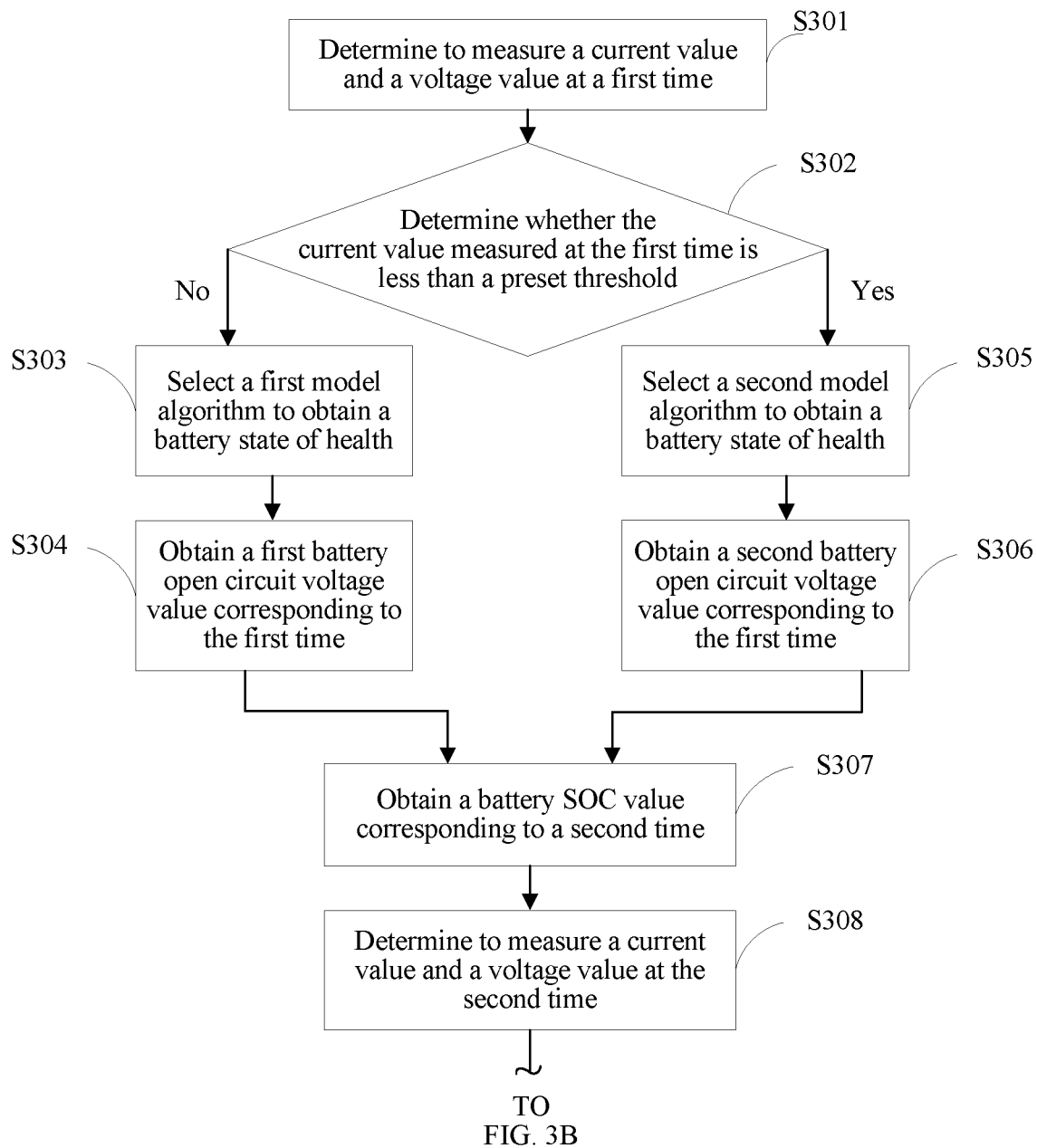
FIG. 3A and FIG. 3B are a schematic flowchart of a method for detecting a battery state of health according to an embodiment of the present disclosure.
Figure 3B:
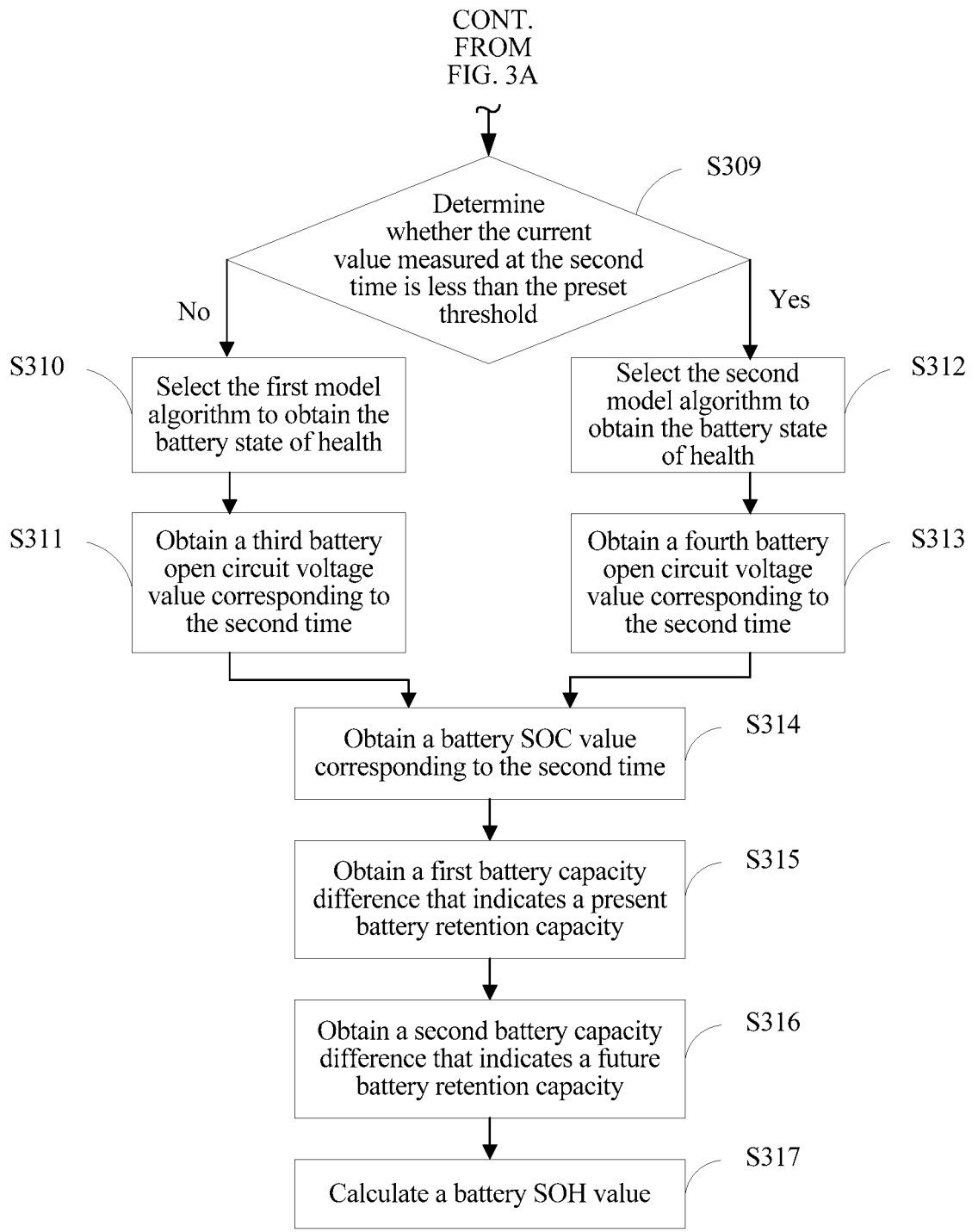

With reference to FIG. 1 and FIG. 2, the following describes in detail how a detection apparatus implements in-service detection of a battery state of health. As shown in FIG. 3A and FIG. 3B, FIG. 3A and FIG. 3B are a schematic diagram of a flowchart of a method for detecting a battery state of health according to an embodiment of the present disclosure.

Step 301: A detection unit 101 determines to measure a current value and a voltage value at a first time, and outputs the current value and the voltage value to a control unit 102 and a data processing unit 103.

In this embodiment of the present disclosure, the current and the voltage are measured twice in a period of time. The period of time includes a start time and an end time. For example, three hours from 9 o'clock to 12 o'clock on June $1^{st}$ is a period of time. In step 301, the start time (that is, the first time) for detecting the battery state of health is determined first, such as 9 o'clock on June $1^{st}$, and then a current value I(t) and a voltage value U(t) that corresponds to the first time are measured.

Step 302: The control unit 102 determines whether the current value measured at the first time is less than a preset threshold.

A current threshold is correlated to a battery capacity. Generally, the control unit 102 may set the current threshold to 0.5 C, and C is a capacity when a battery is discharged for an hour. This setting manner is well known to persons skilled in the art. Alternatively, the current threshold may be set according to a service requirement or experience of persons skilled in the art. The example herein does not limit implementation manners of the present disclosure.

Step 303: If the current value measured at the first time is greater than or equal to the preset threshold, the control unit 102 selects a first model algorithm to obtain the battery state of health, and outputs a selection result to the data processing unit 103 by using instruction information.

Step 304: The data processing unit 103 obtains a first battery open circuit voltage value according to the first model algorithm.

The first model algorithm is corresponding to an equivalent circuit of a first-order model. A quantity of model orders refers to a quantity of loops formed by a resistor and a capacitor (RC loop) that are connected in parallel in an equivalent circuit.

Figure 4:
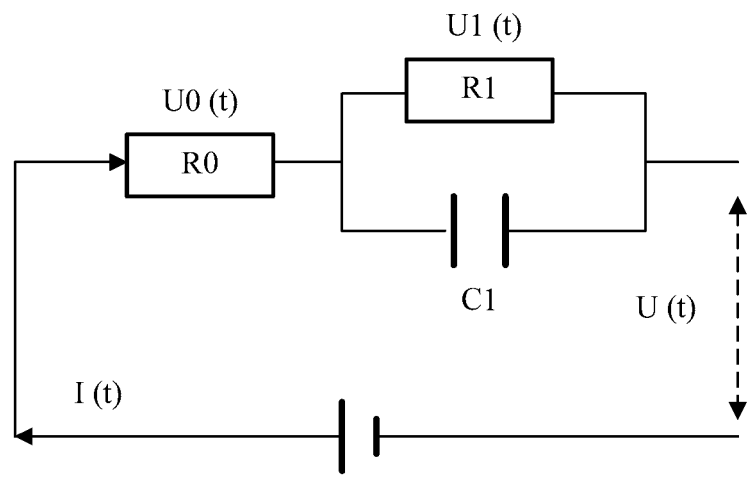
FIG. 4 is a schematic diagram of an equivalent circuit of a first-order model according to an embodiment of the present disclosure.

Further, the equivalent circuit of the first-order model has one RC loop. Referring to FIG. 4, FIG. 4 is a schematic diagram of an equivalent circuit of a first-order model according to an embodiment of the present disclosure. $R_0$ and $R_1$ in the figure represent resistors, $C_1$ represents a capacitor, and $R_1$ and $C_1$ form an RC loop. Based on the equivalent circuit of the first-order model, the first battery open circuit voltage is calculated by using the following formula 1:

$$OCV = U(t) + U_0(t) + U_1(t),$$

where OCV represents a battery open circuit voltage; $U_0(t)$ represents a voltage of $R_0$, that is, $U_0(t) = R_0 \times I(t)$; $U_1(t)$ represents a voltage of the RC loop formed by $R_1$ and $C_1$, that is, $U_1(t) = R_1 \times I(t)$; and U(t) represents a voltage between two ends of the equivalent circuit, that is, the voltage measured by the detection unit 101. U(t) and I(t) are measured by the detection unit 101, and $R_0$, $R_1$, and $C_1$ are model parameters and take preset values. Therefore, formula 1 may be accordingly changed to:

$$OCV = U(t) + R_0 \times I(t) + R_1 \times I(t).$$

It should be noted that the first battery open circuit voltage value obtained in step 304 is corresponding to the first time, and may be represented by $OCV_{start}$ to help understand context of this application.

Step 305: If the current value is less than the preset threshold, the control unit 102 selects a second model algorithm to obtain the battery state of health, and outputs a selection result to the data processing unit 103 by using instruction information.

Step 306: The data processing unit 103 obtains a second battery open circuit voltage value according to the second model algorithm.

Figure 5:
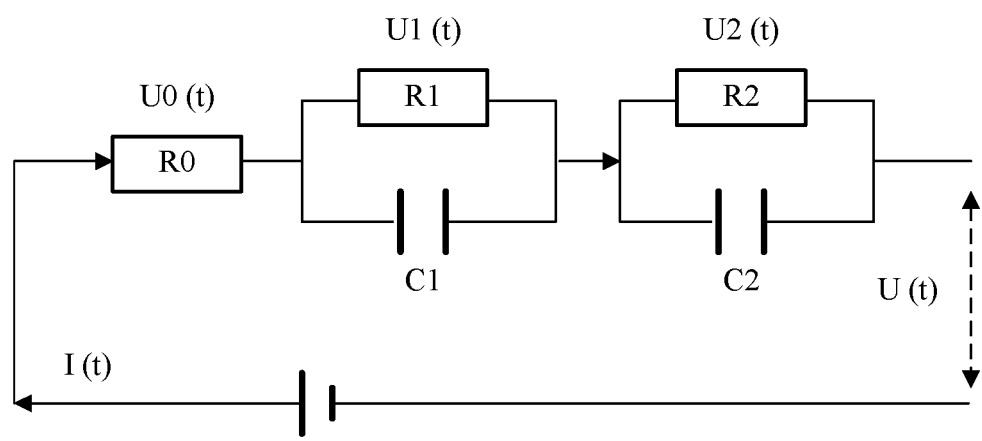
FIG. 5 is a schematic diagram of an equivalent circuit of a second-order model according to an embodiment of the present disclosure.

The second model algorithm is corresponding to an equivalent circuit of a second-order model. Further, the equivalent circuit of the second-order model has two RC loops. Referring to FIG. 5, FIG. 5 is a schematic diagram of an equivalent circuit of a second-order model according to an embodiment of the present disclosure. $R_0$, $R_1$, and $R_2$ in the figure represent resistors, $C_1$ and $C_2$ represent capacitors, $R_1$ and $C_1$ form an RC loop, and $R_2$ and $C_2$ form another RC loop. Based on the equivalent circuit of the second-order model, the second battery open circuit voltage is calculated by using the following formula 2:

$$OCV = U(t) + U_0(t) + U_1(t) + U_2(t),$$

where OCV represents a battery open circuit voltage; $U_0(t)$ represents a voltage of $R_0$, that is, $U_0(t) = \times I(t)$; $U_1(t)$ represents a voltage of the RC loop formed by $R_1$ and $C_1$, that is, $U_1(t) = R_1 \times I(t)$; $U_2(t)$ represents a voltage of the RC loop formed by $R_2$ and $C_2$ that is, $U_2(t) = R_2 \times I(t)$; and U(t) represents a voltage between two ends of the equivalent circuit. U(t) and I(t) are measured by the detection unit 101, and $R_0$, $R_1$, $R_2$, $C_1$ and $C_2$ are model parameters and take preset values. Therefore, formula 2 may be accordingly changed to:

$$OCV = U(t) + R_0 \times I(t) + R_1 \times I(t) + R_2 \times I(t).$$

It should be noted that the second battery open circuit voltage value obtained in step 306 is corresponding to the first time, and may be represented by $OCV_{start}$ to help understand the context of this application. In addition, persons skilled in the art can know and understand, according to existing technical means, how the detection unit 101 measures U(t) and I(t). The values of $R_0$, $R_1$, $R_2$, $C_1$ and $C_2$ may be set according to a service requirement, or may be set by persons skilled in the art according to experience. Because a setting manner is the prior art well known to persons skilled in the art, details are not described herein.

Step 307: The data processing unit 103 obtains, according to the first battery open circuit voltage value or the second battery open circuit voltage value, a battery SOC value corresponding to the first time.

Various implementation manners may be used for the data processing unit 103 to obtain the battery SOC value. For example, the battery SOC value is calculated by using a formula. Specifically, a correspondence between a battery open circuit voltage and a battery SOC may be represented by using the following formula 3:

$$OCV = a_1(SOC)^n + a_2(SOC)^{n-1} + \ldots + a_n(SOC) + b,$$

where OCV represents a battery open circuit voltage, and SOC represents a battery state of charge; n, $a_1$, $a_2$, $a_n$, and b are constant parameters, and may be set according to a service requirement, or may be set by persons skilled in the art according to experience, and n is a positive integer. For example, when n is 7, with reference to formula 3, an expression of the correspondence between a battery open circuit voltage and a battery SOC may be: $OCV = -89.6 \times (SOC)^7 + 320 \times (SOC)^6 - 447.7 \times (SOC)^5 + 307.7 \times (SOC)^4 - 105.2 \times (SOC)^3 + 15.3 \times (SOC)^2 + 0.3444 \times (SOC) + 3.31$.

Because a setting manner is the prior art well known to persons skilled in the art, details are not described herein.

For another example, the data processing unit 103 may obtain the battery SOC value by reading information about the correspondence that is between a battery open circuit voltage and a battery SOC and that is pre-stored in a memory 104. The correspondence information is obtained after multiple experiment adjustments when the battery is in an out-of-service state. The experiment adjustment manner is the prior art well known to persons skilled in the art, and details are not described herein.

In the foregoing steps, different battery open circuit voltage values are obtained according to various model algorithms. Correspondingly, in this step, different battery SOC values are obtained according to different battery open circuit voltage values. It should be noted that the battery SOC value obtained in step 305 is corresponding to the first time, and may be represented by $SOC_{start}$ to help understand the context of this application.

Step 308: The detection unit 101 determines to measure a current value and a voltage value at a second time, and outputs the current value and the voltage value to the control unit 102 and the data processing unit 103.

In step 301, the start time (that is, the first time) for detecting the battery state of health is determined first. Then in step 308, an end time (that is, the second time) for detecting the battery state of health is determined, such as 12 o'clock on June $1^{st}$. A current value I(t) and a voltage value U(t) corresponding to the second time are measured.

Step 309: The control unit 102 determines whether the current value measured at the second time is less than a preset threshold.

Step 310: If the current value measured at the second time is greater than or equal to the preset threshold, the control unit 102 selects the first model algorithm to estimate the battery state of health, and outputs a selection result to the data processing unit 103 by using instruction information.

Step 311: The data processing unit 103 obtains a third battery open circuit voltage value according to the first model algorithm.

The third open circuit voltage value is obtained according to formula 1. The third battery open circuit voltage value obtained in step 311 is corresponding to the second time, and may be represented by $OCV_{end}$ to help understand the context of this application.

Step 312: If the current value measured at the second time is less than the preset threshold, the control unit 102 selects the second model algorithm to estimate the battery state of health, and outputs a selection result to the data processing unit 103 by using instruction information.

Step 313: The data processing unit 103 obtains a fourth battery open circuit voltage value according to the second model algorithm.

The fourth open circuit voltage value is obtained according to formula 2. The fourth battery open circuit voltage value obtained in step 313 is corresponding to the second time, and may be represented by $OCV_{end}$ to help understand the context of this application.

Step 314: The data processing unit 103 obtains, according to the third battery open circuit voltage value or the fourth battery open circuit voltage value, a battery SOC value corresponding to the second time.

The battery SOC value is obtained according to formula 3 or by reading the information about the correspondence that is between a battery open circuit voltage and a battery SOC and that is pre-stored in the memory 104. The battery SOC value obtained in step 314 is corresponding to the second time, and may be represented by using $SOC_{end}$ to help understand the context of this application.

Step 315: The data processing unit 103 calculates a first battery capacity difference that is based on the first time and the second time and that indicates a present battery retention capacity.

The data processing unit 103 obtains $OCV_{start}$ and $SOC_{start}$ on a basis of the first time, and obtains $OCV_{end}$ and $SOC_{end}$ on a basis of the second time. Then, the data processing unit 103 may use multiple implementation manners to obtain a battery capacity $Q_{start}$ corresponding to the first time and a battery capacity $Q_{end}$ corresponding to the second time, and calculate a first battery capacity difference $\Delta Q_1$ by using formula 4:

$$\Delta Q_1 = |Q_{end} - Q_{start}|.$$

For example, after obtaining $OCV_{start}$ and $OCV_{end}$, the data processing unit 103 may obtain $Q_{start}$ and $Q_{end}$ according to a correspondence between a battery capacity and a battery open circuit voltage. The correspondence between a battery capacity and a battery open circuit voltage may be represented by using formula 5:

$$Q = d_1(OCV)^n + d_2(OCV)^{n-1} + \ldots + d_n(OCV) + g,$$

where Q represents a battery capacity, and OCV represents a battery open circuit voltage. When the battery open circuit voltage is $OCV_{start}$, $Q_{start}$ OCV is calculated according to formula 5. When the battery open circuit voltage is $OCV_{end}$, $Q_{end}$ is calculated according to formula 5. n, $d_1$, $d_2$, $d_n$, and g are constant parameters, and may be set according to a service requirement, or may be set by persons skilled in the art according to experience, and n is a positive integer. For example, when n is 5, with reference to formula 5, an expression of the correspondence between a battery capacity and a battery open circuit voltage may be: $Q = -12.2 \times (OCV)^5 + 217.2 \times (OCV)^4 - 1531.4 \times (OCV)^3 + 5368 \times (OCV)^2 - 9350.9 \times (OCV) + 6480.1$. Because a setting manner is the prior art well known to persons skilled in the art, details are not described herein.

Alternatively, after obtaining $OCV_{start}$ and $OCV_{end}$, the data processing unit 103 may obtain $Q_{start}$ and $Q_{end}$ by reading information about the correspondence that is between a battery capacity and a battery open circuit voltage and that is pre-stored in the memory 104. The correspondence information is obtained by experimental fitting for multiple times when the battery is in an out-of-service state. The experimental fitting manner is the prior art well known to persons skilled in the art, and details are not described herein.

For another example, after obtaining $SOC_{start}$ and $SOC_{end}$, the data processing unit 103 may obtain $Q_{start}$ and $Q_{end}$ according to a correspondence between a battery capacity and a battery SOC. The correspondence between a battery capacity and a battery SOC may be represented by using formula 6:

$$Q = Q_f \times SOC,$$

where Q represents a battery capacity, SOC represents a battery state of charge, and $Q_f$ represents a nominal battery capacity at delivery. When the battery SOC value is $SOC_{start}$, $Q_{start}$ is calculated according to formula 6. When the battery SOC value is $SOC_{end}$, $Q_{end}$ is calculated according to formula 6.

Alternatively, after obtaining $SOC_{start}$ and $SOC_{end}$, the data processing unit 103 may obtain $Q_{start}$ and $Q_{end}$ by reading information about a correspondence that is between a battery capacity and a battery SOC and that is pre-stored in the memory 104. The correspondence information is obtained by experimental fitting for multiple times when the battery is in an out-of-service state. The experimental fitting manner is the prior art well known to persons skilled in the art, and details are not described herein.

Step 316: The data processing unit 103 calculates, according to the current value measured at the first time and the current value measured at the second time by the detection unit 101, a second battery capacity difference that indicates a future battery retention capacity.

The data processing unit 103 obtains the current value measured at the first time and the current value measured at the second time by the detection unit 101, and calculates, according to formula 7, a second battery capacity difference $\Delta Q_2$ that indicates the future battery retention capacity:

$$\Delta Q_2 = \eta \int_{t_{start}}^{t_{end}} i(t) dt,$$

where $\eta$ is battery coulombic efficiency whose value range is $0 < \eta \leq 1$, and a value of $\eta$ may be set according to a battery type. For example, for a lithium-ion battery, the value of $\eta$ may be 1. For a lead-acid storage battery, a nickel-hydrogen or a nickel-cadmium battery, the value of $\eta$ may be set from 0.9 to 1 (including 0.9 and 1). $t_{start}$ represents the first time, and $t_{end}$ represents the second time. It may be learned from formula 7 that $\Delta Q_2$ that indicates a future battery performance state may be obtained by performing integral calculation on the current value measured at the first time and the current value measured at the second time.

Step 317: The data processing unit 103 receives a battery temperature value measured by the detection unit, and calculates a battery SOH value with reference to the first battery capacity difference and the second battery capacity difference.

The data processing unit 103 calculates the battery SOH value according to formula 8:

$$SOH = k_T \frac{\Delta Q_2}{\Delta Q_1} \times 100\%,$$

where SOH represents the battery state of health, $\Delta Q_2$ represents the first battery capacity difference, $\Delta Q_2$ represents the second battery capacity difference, and $k_T$ is a temperature modification coefficient. A battery temperature affects a battery state of health. The data processing unit 103 may obtain $k_T$ by reading information about a correspondence that is between a battery temperature value and a temperature modification coefficient and that is pre-stored in the memory 104. Obtaining the correspondence information is the prior art well known to persons skilled in the art, and details are not described herein.

In conclusion, in this embodiment of the present disclosure, a battery SOH may be detected in an in-service state, and battery aging may be monitored accurately and in a timely manner, so as to ensure that an apparatus such as a data center device, an optical communications device, or a base station normally supplies power for a load, and avoid affecting a service. In addition, because detection is performed based on an in-service state in this embodiment of the present disclosure, in comparison with a detection method in an out-of-service state in the prior art, a battery SOH value is relatively accurate, and the battery SOH value is relatively reliable in application. Therefore, the battery SOH value obtained according to this embodiment of the present disclosure can be used in application of various types, such as estimation of time for battery replacement, so as to effectively ensure device operation safety.

Optionally, in another embodiment, the control unit 102 may further determine, by using a Kalman or an improved Kalman filtering algorithm, accuracy of an OCV value and an SOC value that are obtained by the data processing unit 103. Using an extended Kalman algorithm as an example, the data processing unit 103 outputs the obtained OCV value and the obtained SOC value to the control unit 102, and the control unit 102 performs corresponding convergence determining on OCV and SOC according to formula 9:

$$P_k = x + (w-x) \times (1 - e^{(-k+2)/y}),$$

where $P_k$ represents noise; e is a base of a natural logarithmic function, and a value of e is 2.718; k is correlated to a sampling frequency, for example, when a sampling frequency is 1 s, the value of k is 1; and x, y, and w are adaptable parameters and take different values according to different model algorithms. For example, for a second-order model algorithm, x is 100, y is 1000, and w is 0.1. The values are well known to persons skilled in the art, and details are not described herein.

For the first time or the second time, if $P_k$ is less than a system preset value, the control unit 102 determines that calculation of OCV and SOC is converged, and values of OCV and SOC meet an accuracy requirement. If $P_k$ is not less than the system preset value, the detection unit 101 is triggered to re-measure a current and a voltage at a new time, and calculate new OCV and SOC with reference to the foregoing steps and procedures (such as step 301 to step 307, or step 308 to step 314). This implementation manner can effectively ensure accuracy of a battery SOH value.

Persons skilled in the art understand that the prior art has progressed to the following degree: difference between implementation manners of hardware and software of various aspects of a system is extremely small, and usage of hardware and software is usually (but not always, because selecting hardware or software in some environments becomes extremely important) a design selection to balance costs and efficiency. Persons skilled in the art understand that there are tools (such as hardware, software, and/or firmware) capable of implementing the processes and/or systems and/or other technologies in this specification, and that preferred tools change according to environments of deployment processes and/or systems and/or other technologies.

Persons of ordinary skill in the art are supposed to understand that all or some of subject matters in this application may be implemented in software with reference to hardware and/or firmware. For example, the subject matters described in this specification may be implemented in software that is performed by one or more processors. In an example of an implementation manner, the subject matters described in this specification may be implemented by using a non-transitory computer readable medium that stores a computer executable instruction. When a computer processor executes the computer executable instruction, the instruction controls the computer to perform steps. An example of a computer readable medium applicable to implementation of the subject matters described in this specification includes the non-transitory computer readable medium, such as a magnetic disk storage device, a chip storage device, a programmable logical device, or an application-specific integrated circuit. In addition, the computer readable medium that implements the subject matters described in this specification may be located on a single device or computing platform, or may be distributed on multiple devices or computing platforms.

Finally, it should be understood that the foregoing embodiments are merely used for explanation, but not limited to the technical solutions in this application. Although this application is described in detail with reference to the foregoing embodiments, it should be understood that persons skilled in the art may make various modifications, changes, or equivalent replacements without departing from the scope of this application and the appended claims.

What is claimed is:

1. A battery management system, comprising:
   a battery; and
   an apparatus for detecting a battery state of health of the battery when the battery in an in-service state in which the battery is supplying power to a load,
   wherein the apparatus for detecting the battery state of health comprises:
   a detection circuit, configured to obtain a current value of the battery and a voltage value of the battery at a first time and obtain a current value of the battery and a voltage value of the battery at a second time, and further configured to obtain a battery temperature value;
   a control circuit, configured to compare each of the current value at the first time and the current value at the second time to a preset threshold, and if the current value at the first time and the current value at the second time are both less than the preset threshold, select a second model algorithm to obtain the battery state of health, or if the current value at the first time and the current value at the second time are not both less than the preset threshold, select a first model algorithm to obtain the battery state of health, wherein a selection result of the control circuit comprises the first model algorithm or the second model algorithm; and
   a data processing circuit, configured to:
   calculate, according to the selection result of the control circuit and the current value and the voltage value at the first time, a battery open circuit voltage value and a battery state of charge value that are corresponding to the first time,
   calculate, according to the selection result of the control circuit and the current value and the voltage value at the second time, a battery open circuit voltage value and a battery state of charge value that are corresponding to the second time,
   calculate a first battery capacity difference that indicates a present battery retention capacity and a second battery capacity difference that indicates a future battery retention capacity, wherein the first battery capacity difference and the second battery capacity difference are based on the first time and the second time, and calculate a battery state of health value according to the battery temperature value, the first battery capacity difference, and the second battery capacity difference.

2. The battery management system according to claim 1, wherein the control circuit selects the first model algorithm; and the data processing circuit is configured to calculate, by using the following formula $OCV=U(t)+R_0 \times I(t)+R_1 \times I(t)$, the battery open circuit voltage value corresponding to the first time and the battery open circuit voltage value corresponding to the second time, wherein OCV represents a battery open circuit voltage, U(t) and I(t) are the voltage value and the current value that are measured by the detection circuit, and $R_0$ and $R_1$ are preset model parameters.

3. The battery management system according to claim 2, wherein the data processing circuit is configured to calculate, by using the following formula $OCV=a_1 (SOC)^n + a_2 (SOC)^{n-1} + \ldots + a_n (SOC)+b$, the battery state of charge value corresponding to the first time and the battery state of charge value corresponding to the second time, wherein OCV represents a battery open circuit voltage, SOC represents a battery state of charge, n, $a_1$, $a_2$, $a_n$, and b are preset constant parameters, and n is a positive integer.

4. The battery management system according to claim 3, wherein after obtaining the battery state of charge value corresponding to the first time and the battery state of charge value corresponding to the second time, the data processing circuit is configured to:

obtain, according to a correspondence between a battery capacity and a battery state of charge value, a battery capacity corresponding to the first time and a battery capacity corresponding to the second time, and calculate the first battery capacity difference according to the following formula:

$$\Delta Q_1 = |Q_{end} - Q_{start}|$$

wherein $\Delta Q_1$ represents the first battery capacity difference, $Q_{start}$ represents the battery capacity corresponding to the first time, and $Q_{end}$ represents the battery capacity corresponding to the second time.

5. The battery management system according to claim 4, wherein the correspondence between a battery capacity and a battery state of charge is represented by using the following formula:

$$Q = Q_f \times SOC,$$

wherein Q represents a battery capacity, SOC represents a battery state of charge, and $Q_f$ represents a nominal battery capacity at delivery.

6. The battery management system according to claim 2, wherein after obtaining the battery open circuit voltage value corresponding to the first time and the battery open circuit voltage value corresponding to the second time, the data processing circuit is configured to:

obtain, according to a correspondence between a battery capacity and a battery open circuit voltage, a battery capacity corresponding to the first time and a battery capacity corresponding to the second time, and calculate the first battery capacity difference according to the following formula:

$$\Delta Q_1 = |Q_{end} - Q_{start}|,$$

wherein $\Delta Q_1$ represents the first battery capacity difference, $Q_{start}$ represents the battery capacity corresponding to the first time, and $Q_{end}$ represents the battery capacity corresponding to the second time.

7. The battery management system according to claim 6, wherein the correspondence between a battery capacity and a battery open circuit voltage is represented by using the following formula:

$$Q = d_1(OCV)^n + d_2(OCV)^{n-1} + \ldots + d_n(OCV) + g,$$

wherein Q represents a battery capacity, OCV represents a battery open circuit voltage, n, $d_1$, $d_2$, $d_n$, and g are preset constant parameters, and n is a positive integer.

8. The battery management system according to claim 6, wherein the data processing circuit obtains the second battery capacity difference by performing integral calculation on the current value at the first time and the current value at the second time according to the following formula:

$$\Delta Q_2 = \eta \int_{t_{start}}^{t_{end}} i(t) dt,$$

wherein $\Delta Q_2$ represents the second battery capacity difference, $\eta$ represents battery coulombic efficiency, $t_{start}$ represents the first time, and $t_{end}$ represents the second time.

9. The battery management system according to claim 8, wherein the data processing circuit is configured to obtain the battery state of health according to the following formula:

$$SOH = k_T \frac{\Delta Q_2}{\Delta Q_1} \times 100\%,$$

wherein SOH represents the battery state of health, $\Delta Q_1$ represents the first battery capacity difference, $\Delta Q_2$ represents the second battery capacity difference, and $k_T$ represents a temperature modification coefficient.

10. The battery management system according to claim 1, wherein the control circuit selects the second model algorithm; and the data processing circuit is configured to calculate, by using the following formula $OCV=U(t)+R_0 \times I(t)+r_1 \times I(t)+R_2 \times I(t)$, the battery open circuit voltage value corresponding to the first time and the battery open circuit voltage value corresponding to the second time, wherein OCV represents a battery open circuit voltage, U(t) and I(t) are the voltage value and the current value that are measured by the detection circuit, and $R_0$, $R_1$ and $R_2$ are preset model parameters.

11. The battery management system according to claim 1, the system further comprising:

a charge and discharge apparatus configured to charge or discharge the battery.

12. A method for detecting a battery state of health, comprising:

measuring a current value of a battery and a voltage value of the battery at a first time, wherein the current value and the voltage value of the battery at the first time are measured when the battery is in an in-service state in which the battery is supplying power to a load;

selecting a selection result for the first time that comprises a first model algorithm or a second model algorithm, wherein if the current value at the first time is less than a preset threshold, the second model algorithm is selected, or if the current value at the first time is not less than the preset threshold, the first model algorithm is selected;

calculating, according to the selection result for the first time and the current value and the voltage value at the first time, a battery open circuit voltage value and a battery state of charge value that are corresponding to the first time;

measuring a current value of the battery and a voltage value of the battery at a second time when the battery is in the in-service state;

selecting a selection result for the second time that comprises the first model algorithm or the second model algorithm, wherein if the current value at the second time is less than the preset threshold, the second model algorithm is selected, or if the current value at the second time is not less than the preset threshold, the first model algorithm is selected;

calculating, according to the selection result for the second time and the current value and the voltage value at the second time, a battery open circuit voltage value and a battery state of charge value that are corresponding to the second time;

calculating a first battery capacity difference that indicates a present battery retention capacity and a second battery capacity difference that indicates a future battery retention capacity, wherein the first battery capacity difference and the second battery capacity difference are based on the first time and the second time; and measuring a battery temperature value, and calculating a battery state of health value according to the battery temperature value, the first battery capacity difference, and the second battery capacity difference.

13. The method according to claim 12, wherein the first model algorithm is selected for the first time, the battery open circuit voltage value corresponding to the first time is calculated by using the following formula:

$$OCV = U(t) + R_0 \times I(t) + R_1 \times I(t),$$

wherein OCV represents a battery open circuit voltage, U(t) and I(t) are the measured voltage value and the measured current value, and $R_0$ and $R_1$ are preset model parameters.

14. The method according to claim 12, wherein the second model algorithm is selected for the first time, and the battery open circuit voltage value corresponding to the first time is calculated by using the following formula:

$$OCV = U(t) + R_0 \times I(t) + R_1 \times I(t) + R_2 \times I(t),$$

wherein OCV represents a battery open circuit voltage, U(t) and I(t) are the measured voltage value and the measured current value, and $R_0$, $R_1$, and $R_2$ are preset model parameters.

15. The method according to claim 14, wherein the battery state of charge value corresponding to the first time and the battery state of charge value corresponding to the second time are calculated by using the following formula:

$$OCV = a_1(SOC)^n + a_2(SOC)^{n-1} + \ldots + a_n(SOC) + b,$$

wherein OCV represents a battery open circuit voltage, SOC represents a battery state of charge, n, $a_1$, $a_2$, $a_n$, and b are preset constant parameters, and n is a positive integer.

16. The method according to claim 15, wherein after the battery state of charge value corresponding to the first time and the battery state of charge value corresponding to the second time are obtained, a battery capacity corresponding to the first time and a battery capacity corresponding to the second time are obtained according to a correspondence between a battery capacity and a battery state of charge value, and the first battery capacity difference is calculated according to the following formula:

$$\Delta Q_1 = |Q_{end} - Q_{start}|,$$

wherein $\Delta Q_1$ represents the first battery capacity difference, $Q_{start}$ represents the battery capacity corresponding to the first time, and $Q_{end}$ represents the battery capacity corresponding to the second time.

17. The method according to claim 16, wherein the correspondence between a battery capacity and a battery state of charge is represented by using the following formula:

$$Q = Q_f \times SOC,$$

wherein Q represents a battery capacity, SOC represents a battery state of charge, and $Q_f$ represents a nominal battery capacity at delivery.

18. The method according to claim 14, wherein after the battery open circuit voltage value corresponding to the first time and the battery open circuit voltage value corresponding to the second time are obtained, a battery capacity corresponding to the first time and a battery capacity corresponding to the second time are obtained according to a correspondence between a battery capacity and a battery open circuit voltage, and the first battery capacity difference is calculated according to the following formula:

$$\Delta Q_1 = |Q_{end} - Q_{start}|,$$

wherein represents the first battery capacity difference, $Q_{start}$ represents the battery capacity corresponding to the first time, and $Q_{end}$ represents the battery capacity corresponding to the second time.

19. The method according to claim 18, wherein the correspondence between a battery capacity and a battery open circuit voltage is represented by using the following formula:

$$Q = d_1(OCV)^n + d_2(OCV)^{n-1} + \ldots + d_n(OCV) + g,$$

wherein Q represents a battery capacity, OCV represents a battery open circuit voltage, n, $d_1$, $d_2$, $d_n$, and g are preset constant parameters, and n is a positive integer.

20. The method according to claim 18, wherein the second battery capacity difference is obtained by performing integral calculation on the current value at the first time and the current value at the second time according to the following formula:

$$\Delta Q_2 = \eta \int_{t_{start}}^{t_{end}} i(t) dt,$$

wherein $\Delta Q_2$ represents the second battery capacity difference, $\eta$ represents battery coulombic efficiency, $t_{start}$ represents the first time, and $t_{end}$ represents the second time.

21. The method according to claim 20, wherein the battery state of health is calculated according to the following formula:

$$SOH = k_T \frac{\Delta Q_2}{\Delta Q_1} \times 100\%,$$

wherein SOH represents the battery state of health, $\Delta Q_2$ represents the first battery capacity difference, $\Delta Q_2$ represents the second battery capacity difference, and $k_T$ is a temperature modification coefficient.

22. The method according to claim 12, further comprising:

charging or discharging the battery using a charge and discharge apparatus.

* * * * *